United States Patent
Lee

(10) Patent No.: US 7,429,509 B2
(45) Date of Patent: Sep. 30, 2008

(54) METHOD FOR FORMING A SEMICONDUCTOR DEVICE

(75) Inventor: Pei-Ing Lee, Changhua County (TW)

(73) Assignee: Nanya Technology Corporation, Taoyuan (TW)

( * ) Notice: Subject to any disclaimer, the term of this patent is extended or adjusted under 35 U.S.C. 154(b) by 419 days.

(21) Appl. No.: 11/145,585

(22) Filed: Jun. 6, 2005

(65) Prior Publication Data

US 2006/0270150 A1 Nov. 30, 2006

Related U.S. Application Data

(63) Continuation-in-part of application No. 11/141,656, filed on May 31, 2005.

(51) Int. Cl.
*H01L 21/8242* (2006.01)

(52) U.S. Cl. ............... 438/243; 438/243; 438/244; 438/246; 438/248; 438/249; 438/270; 438/301; 438/386; 438/589; 257/E21.652

(58) Field of Classification Search ........... 438/386, 438/238, 242, 243–249, 270, 301, 589; 257/E21.652
See application file for complete search history.

(56) References Cited

U.S. PATENT DOCUMENTS

| | | | | |
|---|---|---|---|---|
| 6,331,459 | B1 * | 12/2001 | Gruening | 438/243 |
| 6,707,095 | B1 * | 3/2004 | Chidambarrao et al. | 257/302 |
| 6,844,591 | B1 | 1/2005 | Tran | |
| 8,015,092 | * | 3/2006 | Jaiprakash et al. | 438/248 |
| 2005/0054157 | A1 * | 3/2005 | Hsu | 438/243 |
| 2005/0067648 | A1 * | 3/2005 | Hung et al. | 257/301 |
| 2006/0228861 | A1 * | 10/2006 | Kang et al. | 438/259 |

* cited by examiner

*Primary Examiner*—Carl Whitehead, Jr.
*Assistant Examiner*—Maliheh Malek
(74) *Attorney, Agent, or Firm*—Quintero Law Office

(57) ABSTRACT

A method for forming a semiconductor device. A substrate is provided, wherein the substrate has recessed gates and deep trench capacitor devices therein. Protrusions of the recessed gates and upper portions of the deep trench capacitor devices are revealed. Spacers are formed on sidewalls of the upper portions and the protrusions. Buried portions of conductive material are formed in spaces between the spacers. The substrate, the spacers and the buried portions to form parallel shallow trenches are patterned to form parallel shallow trenches for defining active regions. A layer of dielectric material is formed in the shallow trenches, wherein some of the buried portions serve as buried contacts.

26 Claims, 3 Drawing Sheets

METHOD FOR FORMING A SEMICONDUCTOR DEVICE

This application is a continuation in part of, NTC 94042, application Ser. No. 11/141,656, filed May 31, 2005, entitled "method for forming a semiconductor device."

BACKGROUND

The present invention relates in general to a method for forming a semiconductor device, and more particularly to a method for forming contacts of a semiconductor device.

Semiconductor devices, such as memory devices, Dynamic Random Access Memory (DRAM) for storage of information, or others, are currently in widespread use, in a myriad of applications.

The conventional method of forming transistor and bit line contact, however, requires at least two photolithography processes resulting in higher fabrication costs relative to a mask or reticle. Serious misalignment among the four photolithography processes, consisting of the capacitor, active area, transistor, and bit line contact, also occurs to affecting fabrication field. Particularly, the failures may become increasingly serious with shrinkage of DRAM dimensions. Accordingly, a new method for forming word and bit line contacts of a memory device is desirable.

SUMMARY

A method for forming a semiconductor device is provided. An exemplary embodiment of a method for forming a semiconductor device comprises providing a substrate having recessed gates and deep trench capacitor devices therein. Protrusions of the recessed gates and upper portions of the deep trench capacitor devices are revealed. Spacers are formed on sidewalls of the upper portions and the protrusions. Buried portions of conductive material are formed in spaces between the spacers. The substrate, the spacers and the buried portions are patterned to form parallel shallow trenches for defining active regions. A layer of dielectric material is formed in the shallow trenches, wherein some of the buried portions serve as buried contacts.

DESCRIPTION OF THE DRAWINGS

The invention can be more fully understood by reading the subsequent detailed description and examples with reference made to the accompanying drawings, wherein.

DETAILED DESCRIPTION OF THE INVENTION

Figure 1:
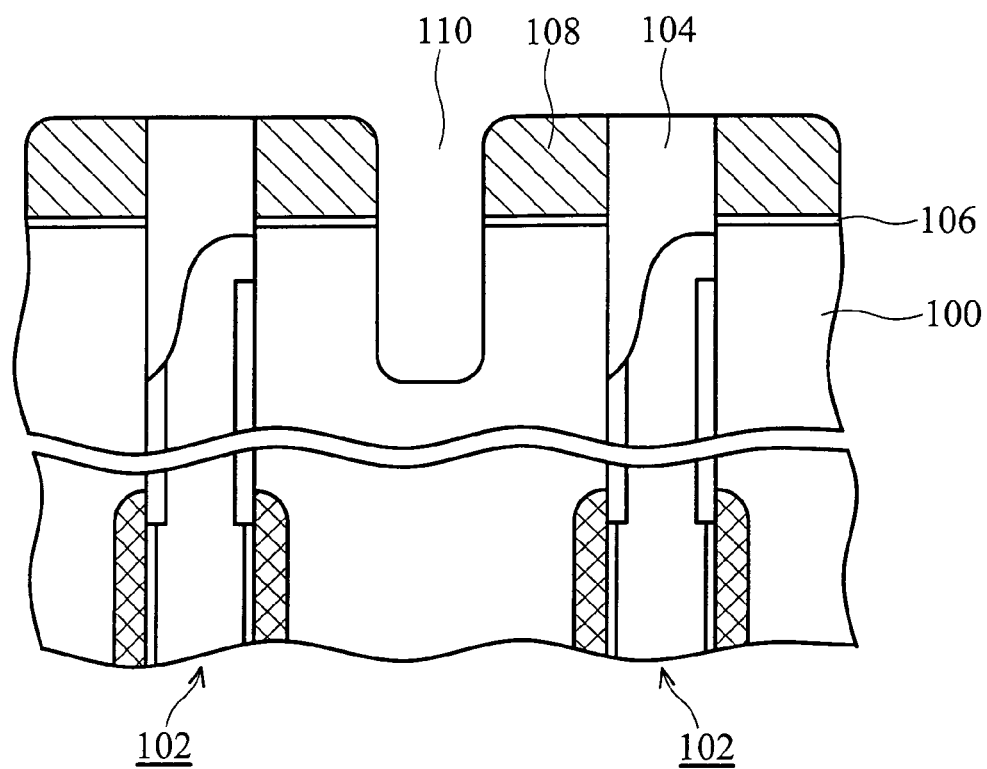
FIG. 1 is cross section view illustrating the method for forming recessed trenches of an embodiment of the invention.

The invention, which provides a method for forming a semiconductor device, will be described in greater detail by referring to the drawings that accompany the invention. It is noted that in the accompanying drawings, like and/or corresponding elements are referred to by like reference numerals. The following description discloses the best-contemplated mode of carrying out the invention. This description is made for the purpose of illustrating the general principles of the invention and should not be taken in a limiting sense. The scope of the invention is best determined by reference to the appended claims.

In this specification, expressions such as "overlying the substrate", "above the layer", or "on the film" simply denote a relative positional relationship with respect to the surface of a base layer, regardless of the existence of intermediate layers. Accordingly, these expressions may indicate not only the direct contact of layers, but also, a non-contact state of one or more laminated layers.

Referring to FIG. 1, a substrate 100 is provided. The substrate 100 has deep trench capacitor devices 102 therein, and the upper portions 104 of the deep trench capacitor devices 102 are above the surface of the substrate 100. A pad layer 106 and a dielectric cap layer, such as nitride (SiN) 108 are formed on the sidewalls of the upper portions 104 of the deep trench capacitor devices 102. The profile of the dielectric cap layer 108 has a concave area which is substantially at the middle of two upper portions 104 of the nearby deep trench capacitors. Thus, the dielectric layer cap 108, the pad layer 106, and the substrate 100 may be self-aligned and etched to form a recess trench 110 between the trench capacitor devices 102.

Figure 2:
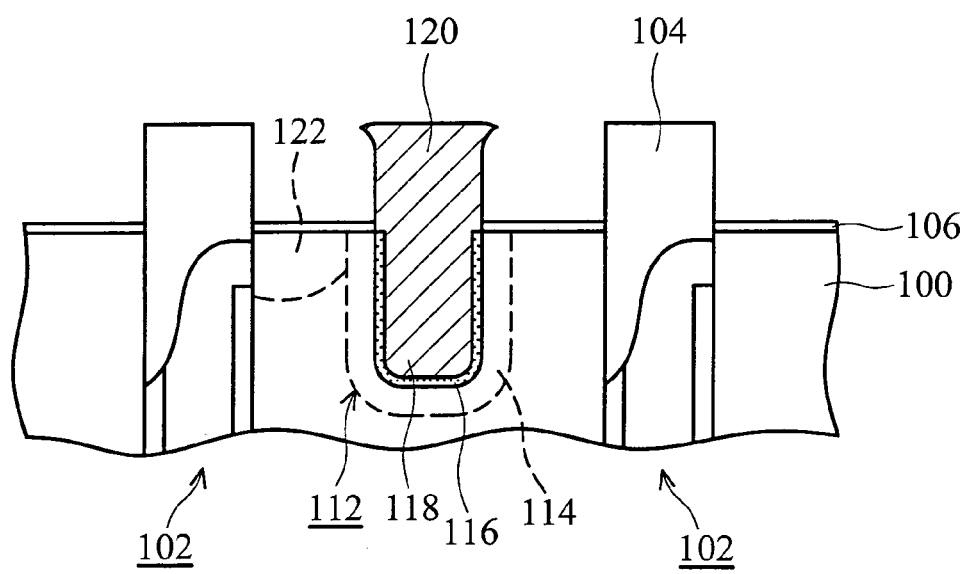
FIG. 2 is cross section view illustrating the method for forming recessed transistors with protrusions of an embodiment of the invention.

Referring to FIG. 2, the substrate 100 adjacent the recessed trench 110 is doped to form channel area 114 surrounding the recessed trench 110. Then a gate dielectric layer 116, preferably comprising silicon oxide, is formed in the recessed trench 110 on the substrate 100. A conductive material, such as polysilicon, tungsten or tungsten silicide, is filled in the recessed trench 110 to form a recessed gate electrode 118. An out diffusion region 122 is formed during the thermal process of forming the gate dielectric layer 116 and/or the other thermal process in subsequently processes.

The upper portions 104 of deep trench capacitor devices 102, the dielectric cap layer 108, and the upper surface of the recessed gate electrodes 118 are planarized, and the dielectric cap layer 108 is then stripped by selective wet etching to reveal the upper portions 104 of deep trench capacitor devices 102 and the protrusions 120 of the recessed gate electrodes 118. The planarizing method comprises a chemical mechanical polishing (CMP) process, a blanket etching back process or a recess etching process. The upper surfaces of the protrusions 120 of the recessed gate electrode 118 are substantially the same level as the upper portions 104 of the deep trench capacitor devices 102.

Figure 3:
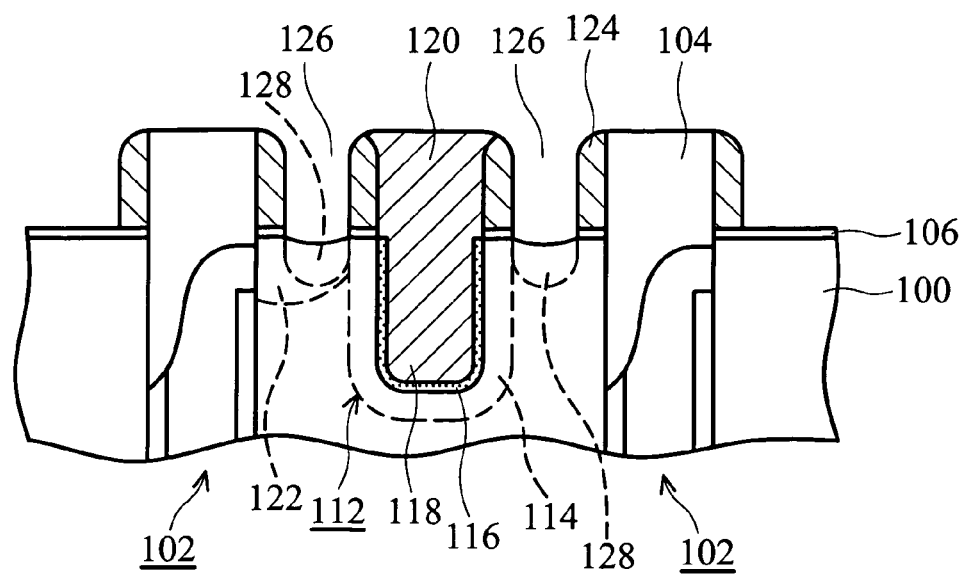
FIG. 3 is cross section view illustrating the method for forming spaces by spacers of an embodiment of the invention.

Referring to FIG. 3, spacers 124 are formed on sidewalls of the upper portions 104 and the protrusions 120 such that spaces 126 between the spacers 124 thereon are self-aligned. The spacers 124 can be formed by deposition and dry etching back of a CVD silicon nitride film. Therefore, the spacers 124 enclose the upper portions 104 and the protrusions 120. And the substrate 100 is covered by the deep trench capacitor devices 102, the recessed transistors 112 and the spacers 124 beyond the circular spaces 126. Thereafter, ion implantation is executed to form the source/drain regions 128 on opposite sides of the recessed channel area 114 and under the spaces 126.

Figure 4:
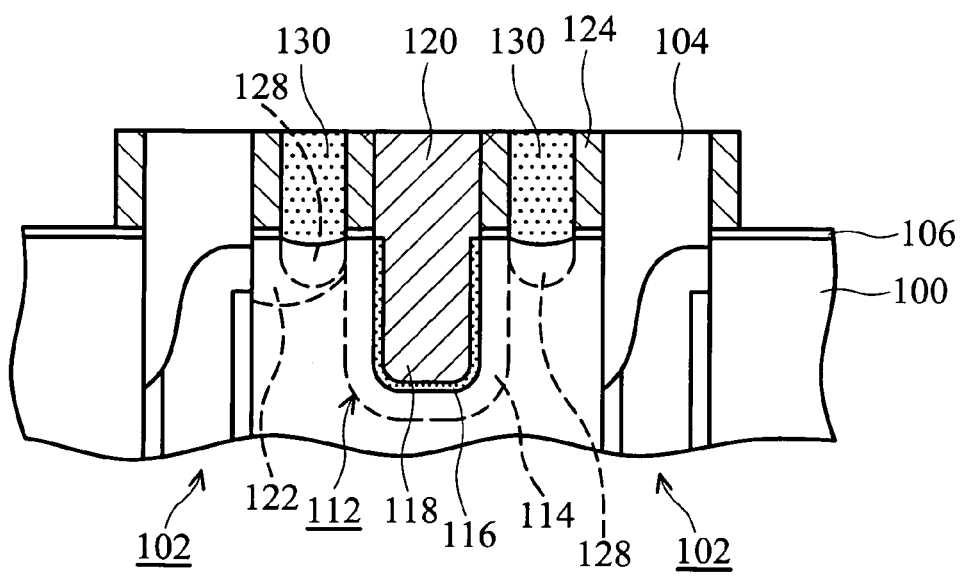
FIG. 4 is cross section view illustrating the method for forming buried portions (buried bit line contacts) of an embodiment of the invention.
Figure 5:
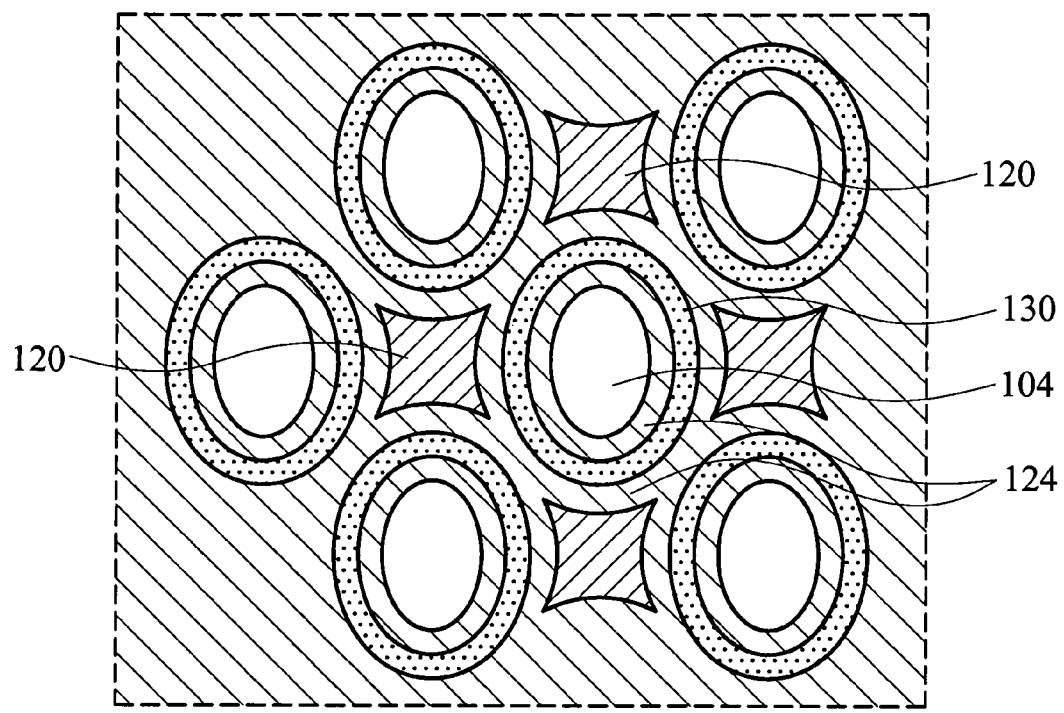
FIG. 5 is a top view illustrating the arrangement of deep trench capacitor devices, recessed gates, spacers, and buried portions of an embodiment of the invention.

Referring to FIG. 4 and FIG. 5, a layer of conductive material, preferably comprising doped poly or metal, is formed over the substrate 100 and filled the spaces 126 between the spacers 124. Then, the layer of conductive material, the spacers 124, the deep trench capacitor devices 102 and the recessed gates 112 are planarized to form buried portions 130 in the spaces 126 between the spacers 124. The buried portions 130 surround the upper portions 104 of the deep trench capacitor devices 102, as shown in the FIG. 4 and FIG. 5. The planarizing process can be accomplished by using a chemical mechanical polish (CMP) process, a blanket etching back process or a recess etching process.

FIG. 5 shows a top view of the patterns of upper portions 104 of deep trench capacitor devices 102, the spacers 124, the buried portions 130, and the protrusions 120 of recessed transistors 112 after planarizing.

Figure 6:
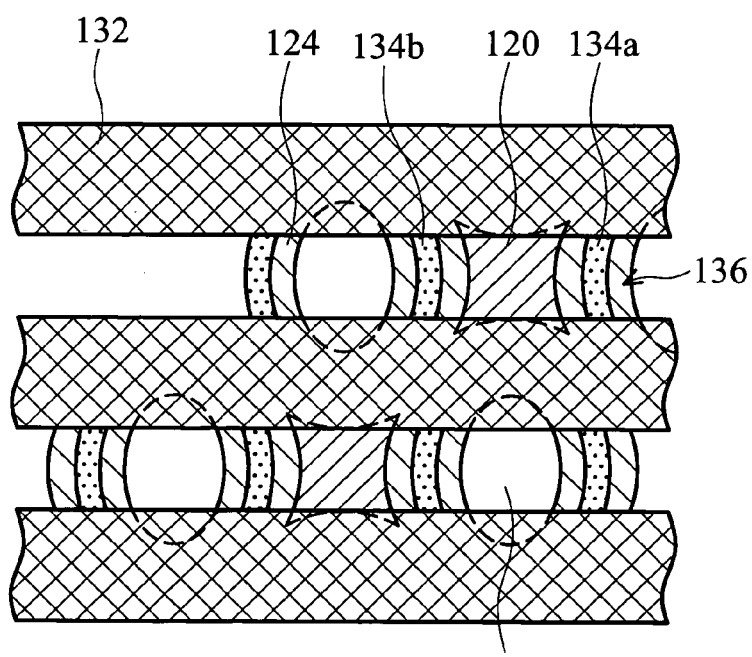
FIG. 6 is a top view illustrating the arrangement of shallow trenches, patterned deep trench capacitor devices, patterned recessed gates, patterned spacers, and patterned buried portions of an embodiment of the invention.

Referring to FIG. 5 and FIG. 6, the spacers 124, the buried portions 130, the deep trench capacitor devices 102 and the recessed gates 112 are patterned to form parallel shallow trenches 132. The patterning process can be accomplished by using of a photolithography process and an etching process. Patterning process simultaneously defines active regions 136 and creates isolation to isolate the transistors. The parallel shallow trenches 132 are adjacent to patterned edges of the deep trench capacitor devices 102 and the recessed gates 112. In other words, the remaining spacers 124 and the remaining buried portions 130 are separated into several regions at sides of the deep trench capacitors 102 and the recessed gates 112. Therefore, the patterned buried portions 134a and 134b are formed, and the patterned buried portions 134a serve as buried contacts or buried bit line contacts 134a.

A layer of dielectric material is then formed in the shallow trenches. The dielectric material can be oxide deposited by high density plasma (HDP) process to form shallow trench isolations in the related art. Consequently, the dielectric material is planarized to expose the upper portions 104, the spacers 124, the patterned buried portions 134, and the protrusions 120.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a semiconductor device, comprising:
    providing a substrate with recessed gates and deep trench capacitor devices surrounding a respective one of the recessed gates, wherein each of the recessed gates has a protrusion extending out of a surface of the substrate and each of the deep trench capacitor devices has an upper portion protruding away from the surface of the substrate;
    forming a spacer on sidewalls of each of the upper portions of the deep trench capacitor devices and each of the protrusions of the recessed gates;
    forming buried portions of conductive material in spaces between the spacers;
    patterning the substrate, the spacers and the buried portions to form parallel shallow trenches for defining active regions; and
    forming a layer of dielectric material in the shallow trenches, wherein some of the buried portions serve as buried contacts.

2. The method for forming a semiconductor device of claim 1, wherein the spacers comprise SiN.

3. The method for forming a semiconductor device of claim 1, wherein the conductive material comprises polysilicon.

4. The method for forming a semiconductor device of claim 1, wherein the spaces further surround the upper portions of the deep trench capacitor devices.

5. The method for forming a semiconductor device of claim 1, wherein the dielectric material comprises oxide.

6. The method for forming a semiconductor device of claim 1, wherein the parallel shallow trenches are formed adjacent to patterned edges of the deep trench capacitor devices and the recessed gates.

7. The method for forming a semiconductor device of claim 1, wherein the buried contacts comprise bit line contacts.

8. A method for forming a semiconductor device, comprising:
    providing a substrate with recessed gates and deep trench capacitor devices surrounding a respective one of the recessed gates, wherein each of the recessed gates has a protrusion extending out of a surface of the substrate and each of the deep trench capacitor has an upper portion protruding away from the surface of the substrate;
    forming a spacer on sidewalls of each of the upper portions of the deep trench capacitor devices and each of the protrusions of the recessed gates;
    forming a layer of conductive material over the substrate;
    planarizing the layer of conductive material to form buried portions in spaces between the spacers;
    patterning the substrate, the spacers, the buried portions, the deep trench capacitor devices and the recessed gates to form parallel shallow trenches for defining active regions; and
    forming a layer of dielectric material in the shallow trenches, wherein some of the buried portions serve as buried contacts.

9. The method for forming a semiconductor device of claim 8, wherein the spacers comprise SiN.

10. The method for forming a semiconductor device of claim 8, wherein the conductive material comprises polysilicon.

11. The method for forming a semiconductor device of claim 8, wherein the planarizing method comprises chemical mechanical polishing (CMP), blanket etching back or recess etching.

12. The method for forming a semiconductor device of claim 8, wherein the spaces further surround the upper portions of the deep trench capacitor devices.

13. The method for forming a semiconductor device of claim 8, wherein the dielectric material comprises oxide.

14. The method for forming a semiconductor device of claim 8, wherein the parallel shallow trenches are formed adjacent to patterned edges of the deep trench capacitor devices and the recessed gates.

15. The method for forming a semiconductor device of claim 8, wherein the buried contacts comprise bit line contacts.

16. A method for forming a semiconductor device, comprising:
    providing a substrate with recessed gates and deep trench capacitor devices surrounding a respective one of the recessed gates, wherein each of the recessed gates has a protrusion extending out of a surface of the substrate and each of the deep trench capacitor devices has an upper portion protruding away from the surface of the substrate;

forming a spacer on sidewalls of each of the upper portions of the deep trench capacitor devices and each of the protrusions of the recessed gates;

forming a layer of conductive material over the substrate;

planarizing the layer of conductive material, the spacers, the deep trench capacitor devices and the recessed gates to form buried portions in spaces between the spacers, wherein the upper portions of the deep trench capacitor devices are surrounded by the buried portions;

patterning the substrate, the spacers, the buried portions, the deep trench capacitor devices and the recessed gates to form parallel shallow trenches for defining active regions; and forming a layer of dielectric material in the shallow trenches, wherein some of the buried portions serve as buried contacts.

17. The method for forming a semiconductor device of claim 16, wherein the spacers comprise SiN.

18. The method for forming a semiconductor device of claim 16, wherein the conductive material comprises polysilicon.

19. The method for forming a semiconductor device of claim 16, wherein the planarizing method comprises chemical mechanical polishing (CM P), blanket etching back or recess etching.

20. The method for forming a semiconductor device of claim 16, wherein the spaces further surround the upper portions of the deep trench capacitor devices.

21. The method for forming a semiconductor device of claim 16, wherein the dielectric material comprises oxide.

22. The method for forming a semiconductor device of claim 16, wherein the parallel shallow trenches are formed adjacent to patterned edges of the deep trench capacitor devices and the recessed gates.

23. The method for forming a semiconductor device of claim 16, wherein the buried contacts comprise bit line contacts.

24. The method for forming a semiconductor device of claim 1, wherein upper surfaces of the recessed gates, the deep trench capacitor devices, and the buried portions are substantially coplanar.

25. The method for forming a semiconductor device of claim 8, wherein upper surfaces of the recessed gates, the deep trench capacitor devices, and the buried portions are substantially coplanar.

26. The method for forming a semiconductor device of claim 16, wherein upper surfaces of the recessed gates, the deep trench capacitor devices, and the buried portions are substantially coplanar.

* * * * *